US005554931A

United States Patent [19]
Allison et al.

[11] Patent Number: 5,554,931
[45] Date of Patent: Sep. 10, 1996

[54] PORTABLE LIVE LINE TOOL TESTER

[75] Inventors: Samuel E. Allison; Dale V. Bright, both of Waco, Tex.

[73] Assignee: Texas Meter & Device Company, Dallas, Tex.

[21] Appl. No.: 398,549

[22] Filed: Mar. 6, 1995

[51] Int. Cl.$^6$ .......................... B32B 31/22; H01M 10/46
[52] U.S. Cl. ................................ 324/557; 320/2; 156/64
[58] Field of Search ............................... 324/557; 320/2; 156/64

[56] References Cited

U.S. PATENT DOCUMENTS

| 4,468,265 | 8/1984 | MacLaughlin et al. | 156/64 |
| 5,391,972 | 2/1995 | Gardner et al. | 320/2 |

OTHER PUBLICATIONS

"IEEE Guide For In-Service Maintenance & Electrical Testing Of Live-Line Tools", The Institute of Electrical & Electrical Engineers, Inc., Aug. 31, 1984, 10 pages.

"Sales Brochure/Memo", Hanco International, Oct. 10, 1994, 4 pages.

*Primary Examiner*—Kenneth A. Wieder
*Assistant Examiner*—Barry C. Bowser
*Attorney, Agent, or Firm*—Michael A. O'Neil

[57] ABSTRACT

The portable live line tool tester of the present invention allows high voltage to be applied to discrete segments of a live-line tool. If the tool has become conductive due to damage or contamination, a leakage meter will detect the flow of current. The tool can then be tested in increments to locate the damaged section. The invention further includes electrical safety interlock circuitry so that the tester is rendered inoperable unless it is correctly rigged and safety shielding is in place. The tester can be folded into an easily portable unit, making it unnecessary to ship tools to a laboratory for testing.

23 Claims, 9 Drawing Sheets

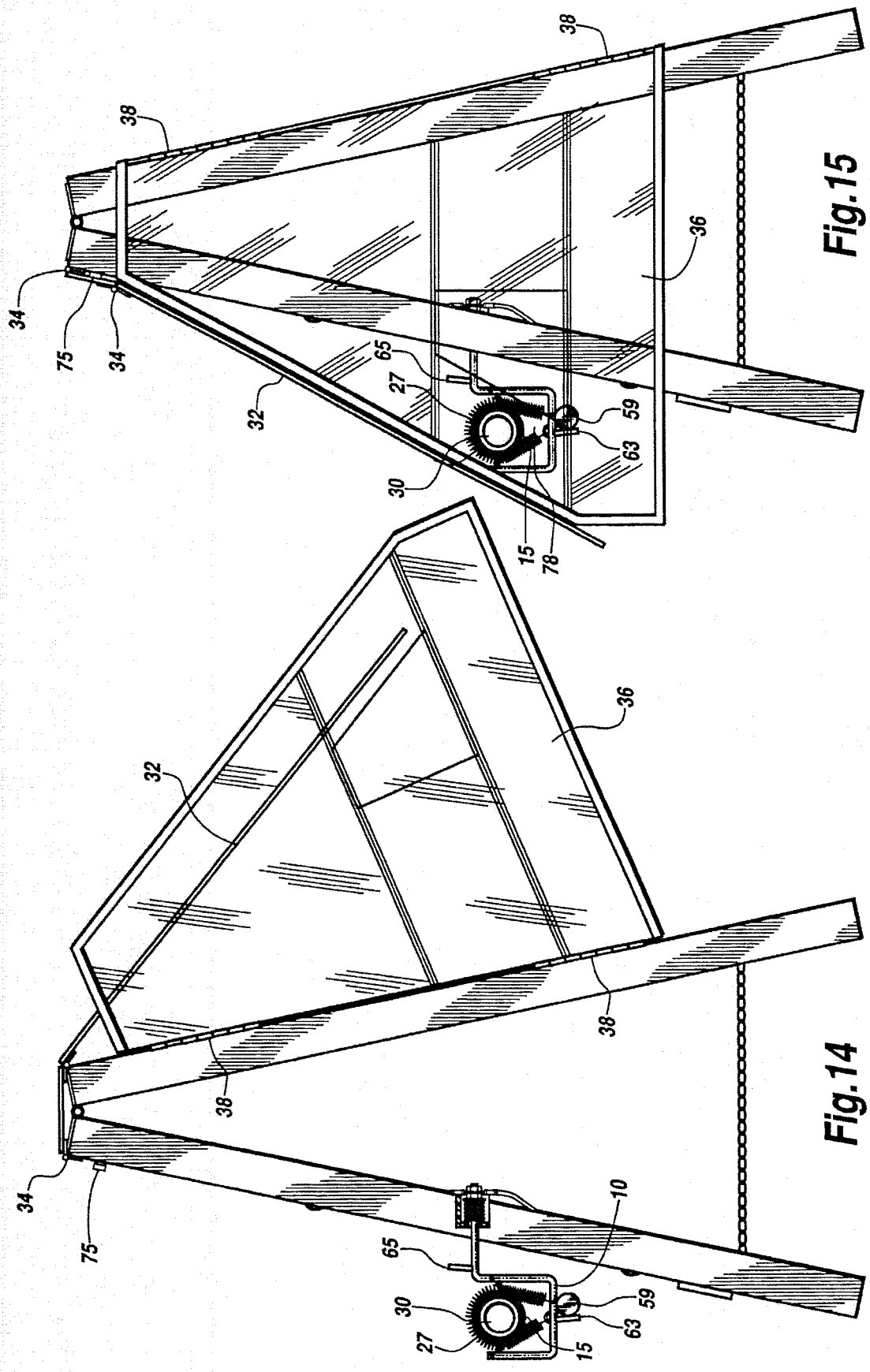

PORTABLE LIVE LINE TOOL TESTER

TECHNICAL FIELD

This invention relates to a portable live-line tool tester, and more particularly to a live-line tool tester capable of complying with OSHA and ASTM test requirements for tools used to contact equipment carrying electric current. This invention further relates to a live-line tool tester that can be transformed from a configuration suitable for transportation to an operative condition with minimum rigging time.

BACKGROUND

Live-line tools, also known in the industry as "hot sticks", are used by workers who must contact electrical equipment carrying high voltage. The live-line tool is constructed principally of a non-conducting material such as wood, fiberglass, or the like. Over time and use, however, the tool may become defective due to contamination with chemical substances or grime, mechanical damage, or absorption of moisture. When defective, the tool conducts electricity, placing the worker and the work site in danger. The risk of injury or fire hazard is increased by the fact that many of the work sites are outside, and thus exposed to inclement weather. Utility companies are at particular risk when trying to restore electrical service during thunderstorms, since water on the surface of a defective tool further increases the conductive potential.

Industries using live-line tools frequently have maintenance procedures to keep the tools clean and waxed to repel moisture. Care is taken to use nonabrasive cleaners leaving no conductive residue and to store the tool in dry surroundings. Still, it is sometimes difficult to determine if a tool is safe for use under field conditions by a simple surface examination. For example, visual examination of a tool will not always reveal a hairline crack that can retain moisture, thereby increasing conductivity of the tool dramatically.

The Occupational Safety and Health Administration (OSHA) has addressed the need for more definitive testing of live-line tools by adopting test standards almost identical to those previously promulgated in ASTM Specification 711. Recently adopted OSHA Maintenance Standard No. 1910.137 requires that a live-line tool be tested along its entire length every two years under both wet and dry conditions. After inspection, the tool is tested by applying 75,000 volts per foot of length for one minute for fiberglass tools and 50,000 volts per foot for one minute for a tool made of wood. A tool must also be tested if it has been repaired or refinished before it is reintroduced to service.

The live-line tool testers currently on the market, such as that manufactured by the Hannon company of Canton, OH, require that the tool be sent to the laboratory for testing. This is expensive and burdensome to industrial users, given the frequency of testing required by the new standards. Portable hand testers such as the model LS-80 manufactured by the A. B. Chance Co. may not meet the stringent new standards referenced above. There is, thus, a need in the industry for a tool tester that can accurately and safely perform these high voltage tests over the length of the tool at the work site instead of in a laboratory environment.

SUMMARY OF THE INVENTION

The present invention provides a fully portable live-line tool tester capable of testing live-line tools to the exacting specifications of the newly imposed industry standards. In the live-line tool tester of the present design, the tool to be tested is suspended upon a series of supports which also act as electrodes, conducting electricity to the tool. Coils surround the tool, providing substantially circumferential coverage.

The supports are connected to a source of high voltage or to ground in alternating sequence so that discrete segments of the tool are tested for electrical conductivity. If the tool conducts electric current, the current flows to a leakage meter. Metal elements on a tool being tested may be isolated by disconnecting the supports corresponding to the portion of the tool having the metal element.

The live-line tool tester of the present invention provides safety interlock devices to ensure that the operator is shielded from arcing or fire hazard associated with high voltage testing. Safety shielding covers the front, sides and back of the tester. A safety interlock prevents operation of the testing apparatus unless the front shielding is in place. The hinge mounted side shielding flaps provide apertures through which a tool that is longer than the testing device may extend. The testing apparatus may be easily rigged down and transported to another location. The frame folds together and wheels are mounted on one set of legs. The supports rotate to a position parallel to the plane of the tester so that the testing apparatus can be compactly stowed. The apparatus is segmented into sections connected by a hinge so that the sections may be folded together for easy transport. The sections have spring loaded contacts which must be engaged to complete the electrical circuit during testing. If the apparatus is not correctly aligned with its segments end to end, the circuit will not be complete and the tester cannot be operated.

BRIEF DESCRIPTION OF DRAWINGS

A more complete understanding of the invention and its advantages will be apparent from the following detailed description taken in conjunction with the accompanying drawings.

Referring to the drawings:

FIG. 14 is a side view of the live-line tool tester in operational configuration with the shielding flaps open;

FIG. 15 is a side view of the live-line tool tester in operational configuration with the shielding flaps in place, ready for testing a tool;

DETAILED DESCRIPTION OF THE INVENTION

Figure 1:
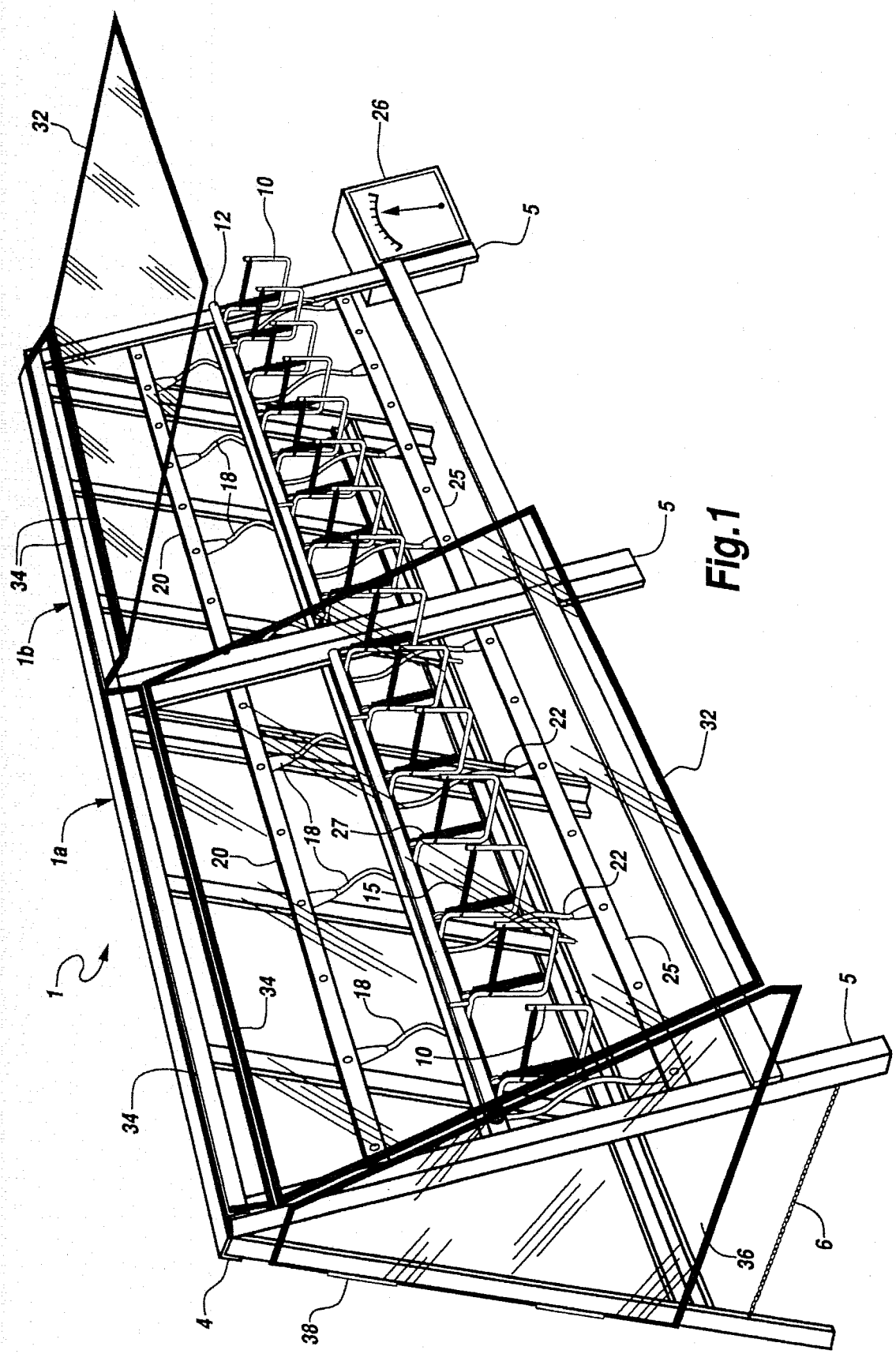
FIG. 1 is a view of the live-line tool tester of the present invention in an operational configuration without a tool to be tested.

Referring now to the drawings, wherein like reference characters designate like or corresponding parts throughout several views, a live-line tool tester 1 is shown in FIG. 1 having a frame 4 with legs 5 held in place by chain 6. U-shaped hooks 10 for supporting the tool to be tested are mounted on a rail 12 across the frame 4. The rail is manufactured of a non-conductive material such as fiberglass or the like. The tool to be tested is received upon coils 15 extending across the mouth of the U-shaped hooks 10. Alligator clip assemblies 18 connect alternating hooks 10 to a hot bus bar 20 which is constructed of a conductive material such as aluminum. During testing, the electric current will flow through the hot bus bar 20. The other hooks 10 are connected by alligator clip assemblies 22 to the ground bus bar 25, also constructed of a conductive material such as aluminum.

Electric current flows from the hot bus bar 20, through the alligator clip assemblies 18, hooks 10, coils 15 and 27 (discussed in detail later) to a tool to be tested 30 (seen in FIGS. 9–11). The alligator clip assemblies 22 connected to the ground bus bar 25 essentially isolate segments of the tool being tested 30. If the tool conducts electric current, it will be detected by leakage meter 26 connected to the ground bus bar 25.

The operator of the live-line tool tester 1 is protected from electrical arcing and fire hazard during testing by front shielding flaps 32 connected to the tester 1 by hinges 34. The front shielding flaps 32 are constructed of a polycarbonate plastic, preferably ⅛ inches in thickness, that insulates the operator from electrical arcing. When access to the hooks 10 is required, as when placing the tool to be tested upon the coils 15, the front shielding flaps 32 may be pivoted around the hinges 34 to the back side of the tester 1 where they do not obstruct access to the tester 1. The operator is further protected by side shielding flaps 36 made of poly-carbonate plastic, also mounted on hinges 38.

Figure 2:
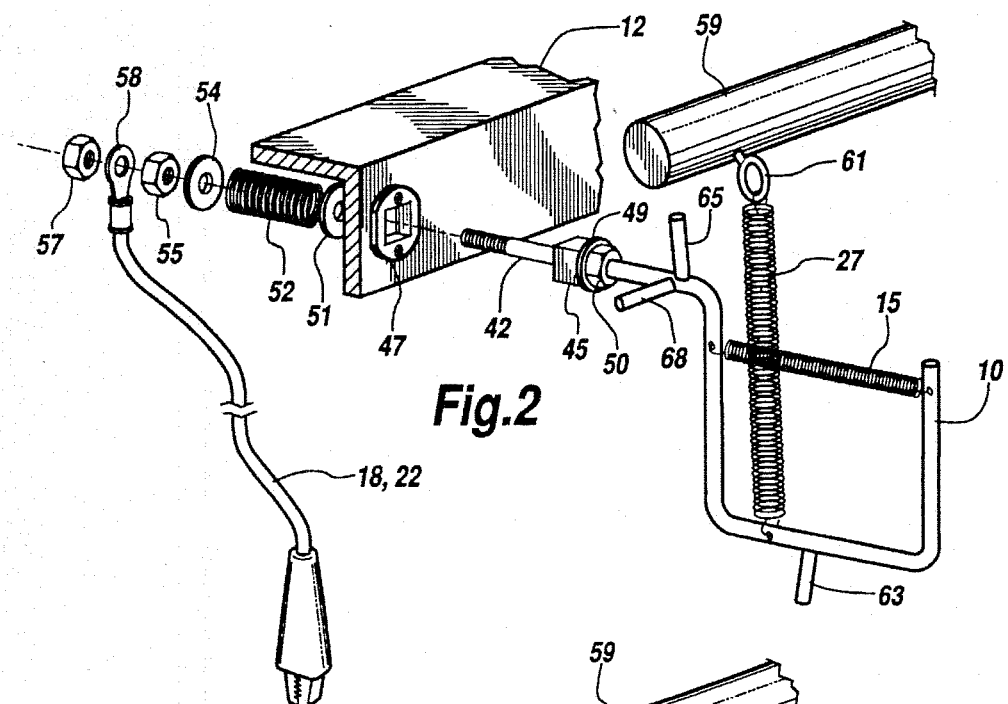
FIG. 2 is an exploded view of a hook assembly providing a means for supporting a tool to be tested.
Figure 3:
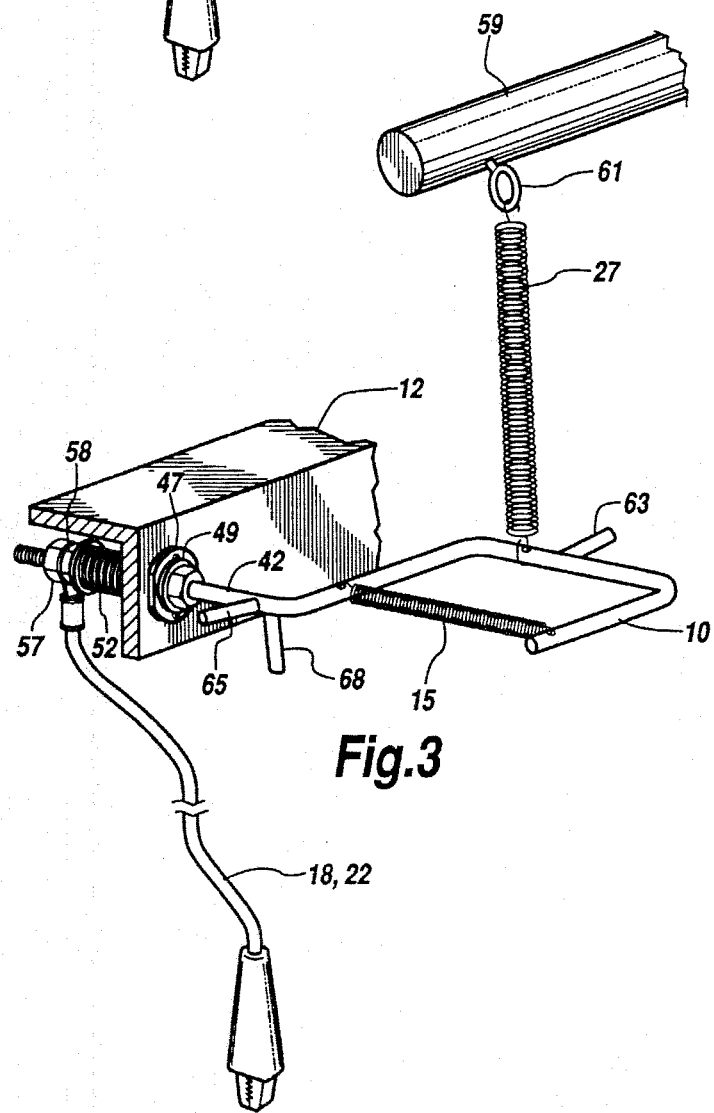
FIG. 3 is the hook assembly in a position for rigging down the live-line tool tester.

The means by which the hooks 10 are mounted to the rail 12 is shown in greater detail in FIGS. 2 and 3. FIG. 2 is an exploded view of one of the hooks 10 showing how it is mounted to rail 40. The hook 10 has a shaft 42 with a square nut 45 which seats in the rail 12 through a washer 47. The square nut 45 is held in the proper position for seating by a washer 49 and a nut 50. A spring 52 held by a washer 54 and washer 51 urges the square nut 45 into the washer 47. The hook 10 is secured to the rail 12 by a nut 55 threaded on the shaft 42. Either of alligator clip assemblies 18 or 22 is affixed to the shaft 42 of the hook 10 by a nut 57, through eye 58, depending on whether that hook is to be connected to the hot bus bar 15 or the ground bus bar 30. The hooks 10 are connected in alternating sequence between the hot bus bar 20 and the ground bus bar 25 so that the tool being tested 30 is tested in discrete segments.

A second coil 27 is attached to rod 59 by eye hook 61. The rod 59 is typically manufactured of a non-conductive material such as phenolic resin. When the live-line tool tester 1 is in operation, the rod 59 is retained under hook 10 by tab 63. This can be more clearly seen in FIG. 11. When the unit is in operational configuration, but the tool to be tested 30 is not in place, the rod 59 is retained behind tab 65. During transportation the rod 59 is retained behind tab 68. This can be more clearly seen in FIGS. 7, 8 and 9.

FIG. 2 illustrates the hook 10 mounted in its operative configuration. The hook 10 and square nut 45 may be pulled from its seat in rail 12 through washer 47, compressing spring 52. The hook 10 may then be rotated 90° and returned to its seat in rail 12. FIG. 3 shows the hook 10 after 90° rotation. This configuration is used when the tester 1 is being readied for transport. The spring 52 urges the square nut 45 to return to its seat in the rail 12.

Figure 4:
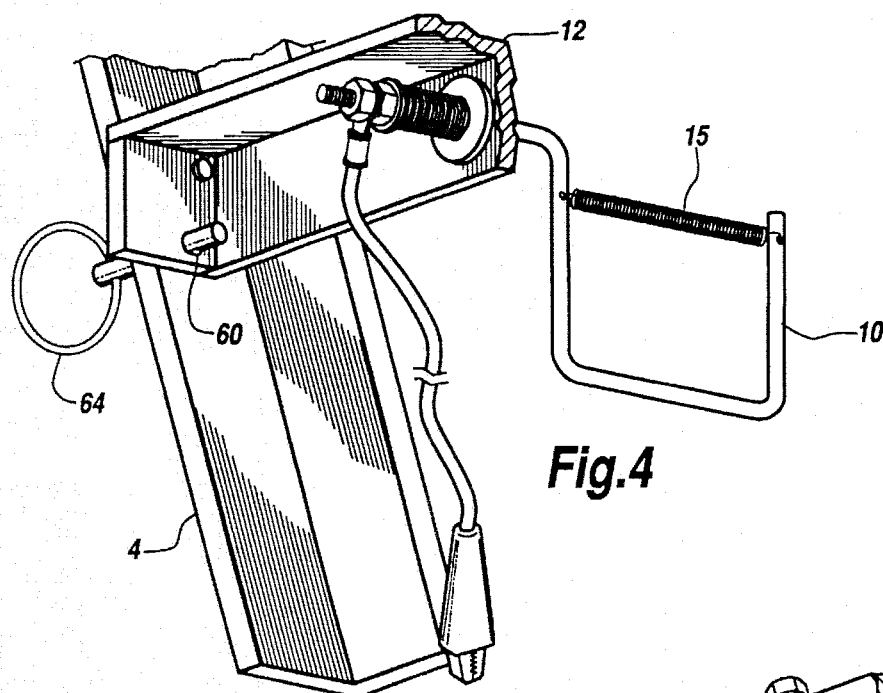
FIG. 4 is a rear view of the frame, rail and hooks.

As shown in FIG. 4, the tester 1 is rigged for operation by removing the key 64 from aperture 60, rotating the rail 12 until it aligns with the frame 4, then reinserting key 64 into aperture 66 to retain the rail 12 in its operational configuration. The hook 10 can then be rotated to its operational configuration as shown in FIGS. 2 and 3.

Figure 5:
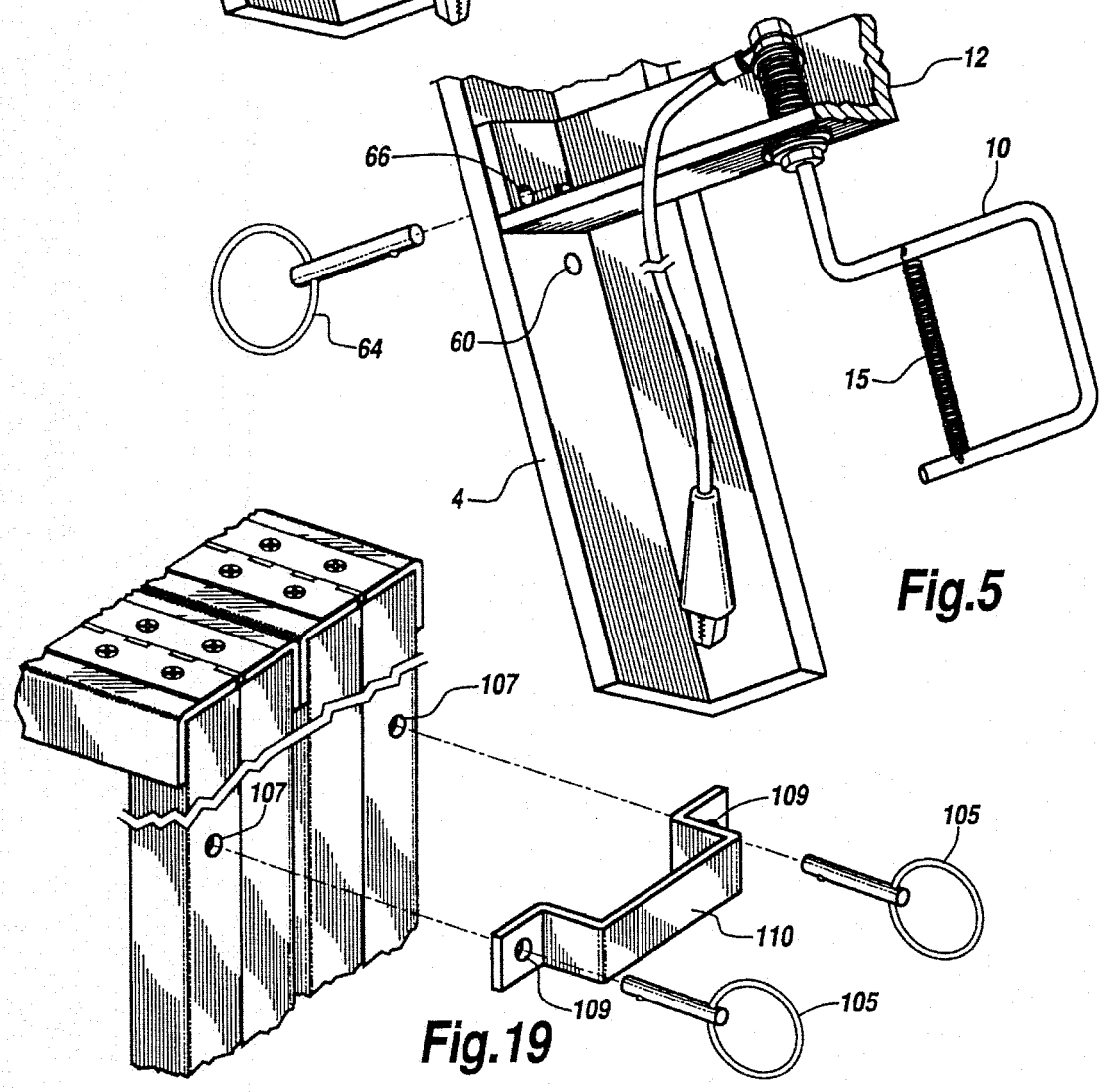
FIG. 5 is a rear view of the frame and rail wherein the rail has been rotated.

FIG. 5 shows the rail 12 rotated for transportation. A key 64 is inserted through aperture 66 to retain the rail 12 in a stable position wherein the longitudinal axis of the hooks 10 is parallel to that of frame 4. This allows the tester 1 to be compactly folded for transportation.

Figure 6:
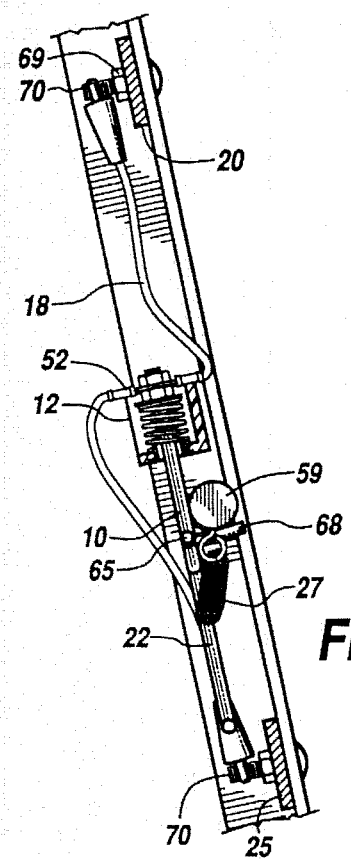
FIG. 6 is a side view of the rail and hooks with spring tensioned mounting rigged down for transportation.
Figure 7:
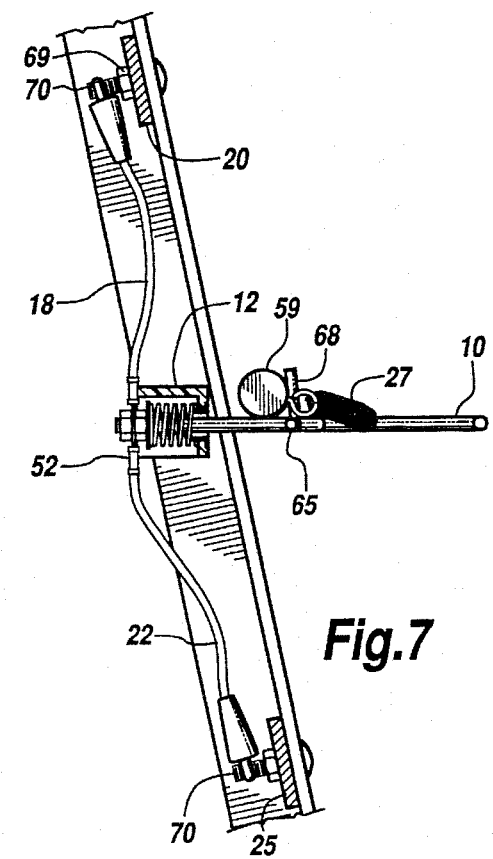
FIG. 7 is a side view of the rail and hooks showing connection to the hot bus bar and the ground bus bar.
Figure 8:
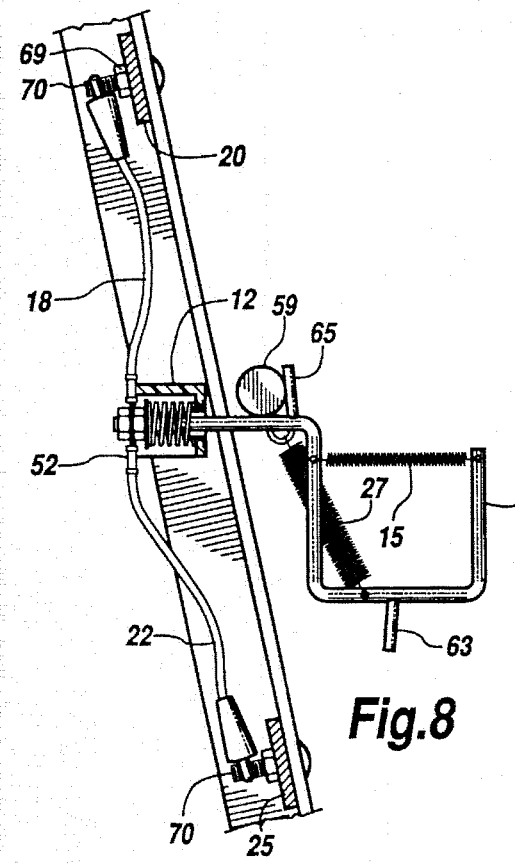
FIG. 8 is a side view of the rail and hooks showing coils ready to receive a tool to be tested.

Referring now to FIGS. 6, 7 and 8, a partial side view of one of the hooks 10 and the manner in which it is mounted to rail 12 is shown. FIG. 6 shows the hooks 10 rigged down for transportation, as described above. The rail 12 rotates downward so that the plane of the "U" of the hooks 10 is parallel to the hot bus bar 20 and the ground bus bar 25, making the tester capable of being compactly folded for transportation. When rigging the tester 1 for operation, the rail 12 is rotated into an upright position as seen in FIG. 7. During transportation, the hook 10 is held in position by tab 68. The rail 12 is held in position by the pin (shown in FIGS. 4 AND 5). The hook 10 can then be placed in its operational position by pulling the square nut 45 from its seat in the rail 12, through washer 47 and rotated 90°. This position is shown in FIG. 8.

The alligator clip assemblies 18 are connected to the hot bus bar 20 and the alligator clip assemblies 22 are connected to the ground bus bar 25. For illustration purposes, both sets of alligator clips 18 and 22 are shown in FIGS. 6, 7 and 8 associated with a single hook 10. In the tester 1, however, each hook 10 is connected to either the hot bus bar 20, or in the alternative, to the ground bus bar 25, as is more clearly shown in FIG. 1. The hooks 10 connected to the ground bus bar 25 by the alligator clip assemblies 22 alternate with the hooks 10 connected to the hot bus bar 20 by the alligator clip assemblies 18. This alternating arrangement allows an electrical potential to be created between adjacent hooks 10. This configuration allows the tool 30 to be tested in discrete segments or a portion of the tool 30 having a metal component to be excluded from the test by disconnecting the corresponding alligator clip assembly 18. A tester 1 configured to exclude a portion of the tool to be tested 30 can be seen in FIG. 16. Alligator clip assembly 18a has been disconnected to exclude the portion of the tool to be tested 30 having a metal hook 67, preventing electrical current from flowing to that portion of the tool 30. The testing of the tool 30 in segments also allows the damaged portion or portions of the tool 30 to be identified. The alligator clips 18 and 22 are removably clamped onto tabs 70 held in place by nuts 69 located on the back side of either the hot bus bar 20 or the ground bus bar 25.

Figure 9:
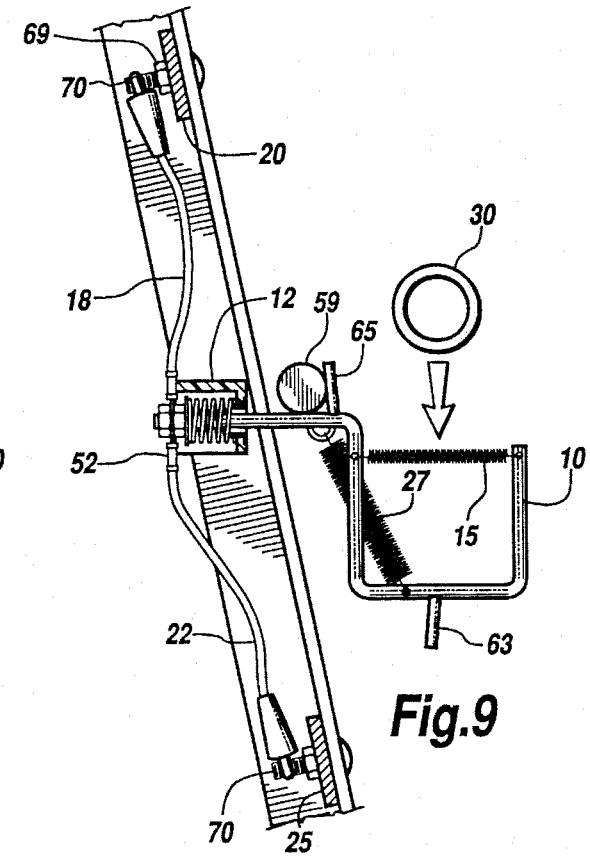
FIG. 9 is a side view of the rail and hooks showing a tool being placed in the coils for testing.
Figure 10:
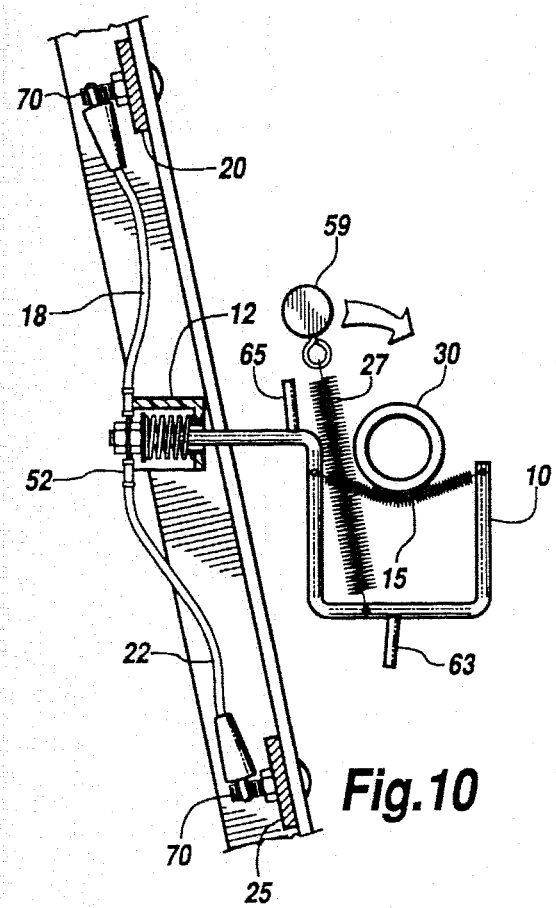
FIG. 10 is a side view of the rail and hooks showing the tension bar being removed from its secured position.
Figure 11:
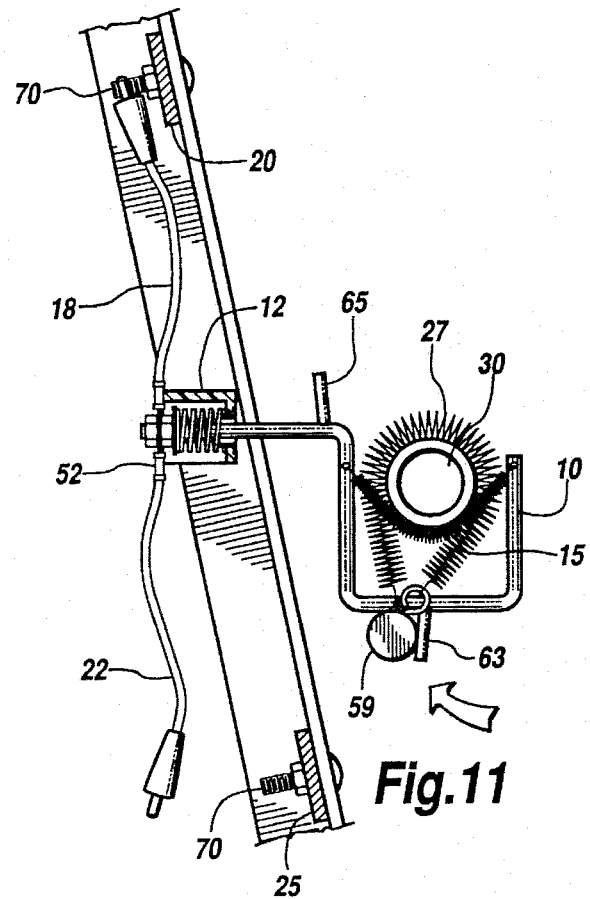
FIG. 11 is a side view showing the rail and hooks with a tool ready for testing.

FIGS. 9, 10 and 11 illustrate the positioning of the tool 30 to be tested in the live-line tool tester 1. The tool 30 is placed upon the coil 15 spanning the mouth of the U-shaped hook 10. As shown in FIG. 10, the tension rod 59 is lifted from behind tab 65, over the tool 30, and placed behind tab 63 extending and wrapping the coil 27 around the tool 30. Coils 15 and 27, thus, contact essentially the entire circumference of tool 30. Coils 15 and 27 are preferably 0.288 inches in diameter and constructed of 0.008 inch diameter stainless steel. Other sizes of springs may also be used. Tension of the coil 27 secures the tension rod 59 behind the tab 63, as is best shown in FIG. 11.

Figure 12:
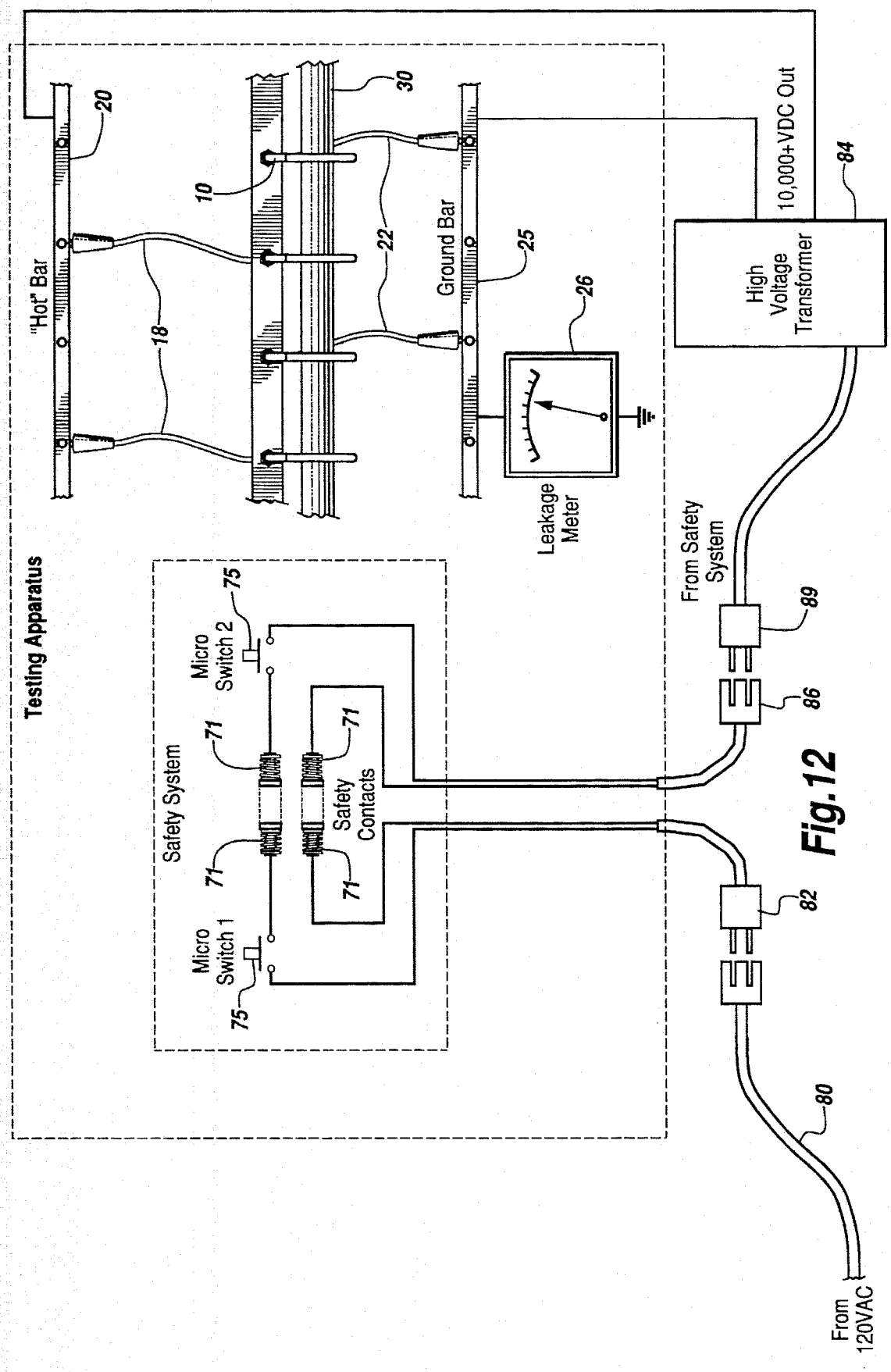
FIG. 12 is a circuit diagram of the live-line tool tester.

FIG. 12 is a circuit diagram showing the flow of electric current through the live-line tool tester 1. Current is received from a standard alternating current power source 80 through a connection 82. Current flows through microswitches 75 and contacts 71 to the high voltage transformer 84 through connectors 86 and 89, if tester segments 1a and 1b are properly aligned end-to-end and if the front shielding flaps 32 are in place. If the front shielding flaps 32 are not covering the hooks 10 supporting the rod to be tested 30 and the bus bars 20 and 25, one or both of the microswitches 75 will not be engaged and the circuit will not be completed, rendering the tester 1 inoperative. Likewise, if the sections of the tester 1a and 1b are not aligned and abutted end to end, spring loaded contacts 71 will not be depressed and the circuit will remain open, rendering the tester inoperable. While two sections are shown for purposes of illustration, other numbers of segments may be used.

If the live-line tool tester is correctly rigged and microswitches 75 and contacts 71 in positions to complete the circuit, the electric current is free to flow through connectors 82, 86 and 89 to the high voltage transformer 84. The current is then stepped up to the voltage required for the test procedure. The high voltage transformer 84 can be one of many known to the industry and is separate from the live-line tool tester of the present invention.

The high voltage current flows from the transformer 84 to the tool being tested 30, through the hot bus bar 20, alligator clip assemblies 18, hooks 10 and finally through coils 15 and 27. Hooks 10 connected to the ground bus bar 25 by the alligator clip assemblies 22, are positioned between the hooks 10 connected to the hot bus bar 20 by the alligator clip assemblies 18, effectively isolating sections of the tool being tested 30 so that they may be tested individually. If the tool 30 is electrically conductive, current will be conducted through one or more of the isolated sections of the tool 30, and then conducted by one or more of the alligator clip assemblies 22 to the ground bus bar 25. Such leakage will be detected by a leakage meter 26, indicating to the operator the severity of any defect.

Figure 13:
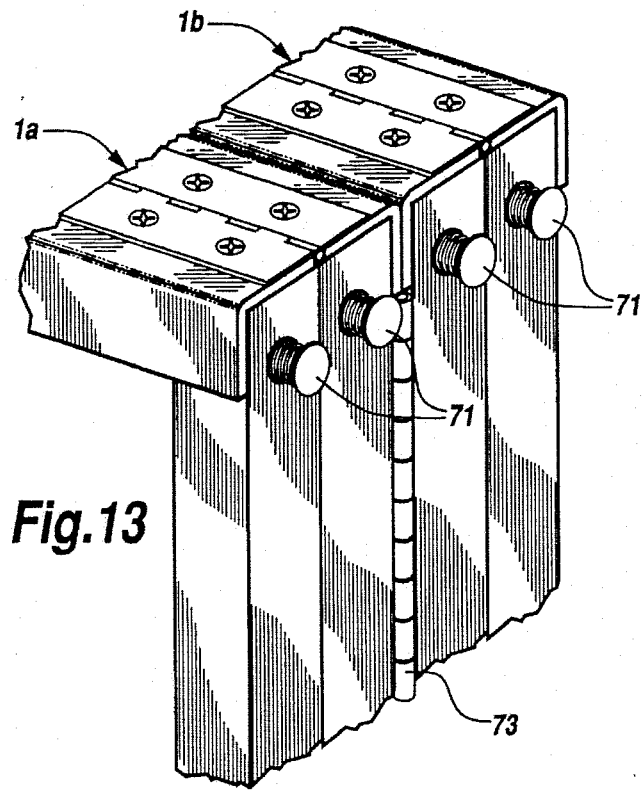
FIG. 13 is an enlarged view of the spring loaded safety contacts located between sections of the live-line tool tester.
Figure 17:
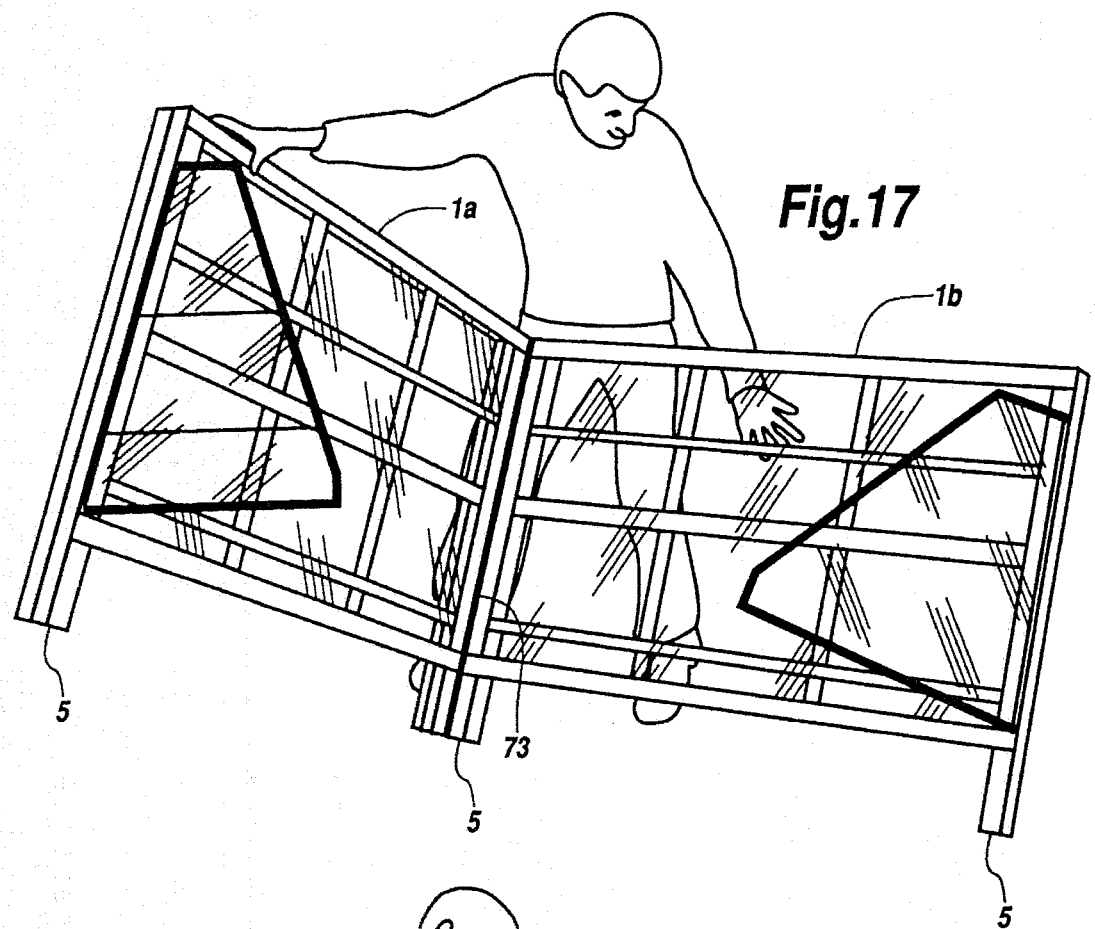
FIG. 17 shows a worker rigging the live-line tool tester for operation.

Safety precautions are of preeminent importance when dealing with high voltage electricity. The hot bus bar 20 and the alligator clip assemblies 18 are color-coded in red and the ground bus bar 25 and the alligator clip assemblies 22 connected to the ground bus bar are colored black to prevent incorrect connections. Spring loaded contacts 71, seen in detail in FIG. 13, are located proximate to a hinge 73 connecting tester segments 1a and 1b. The tester 1 cannot be operated if tester segments 1a and 1b are not properly aligned end to end. The spring loaded contacts 71 engage one another when the tester 1 is unfolded from its travel position to its operative position, as is best shown in FIG. 17. When tester segments 1a and 1b are properly aligned in an end-to-end configuration, the spring loaded contacts 71 are fully depressed. If the spring loaded contacts 71 do not fully depress against one another, the electric circuit is not complete and the tester cannot be operated.

The tester 1 cannot be operated unless the safety shielding is properly engaged. FIG. 14 shows the live-line tool tester 1 rigged for testing, but with the front shielding flaps 32 and the side shielding flaps 36 in an open position. Safety lockout microswitches 75, one microswitch for each front shielding flap 32, remain in open positions, preventing the flow of electric current through the live-line tool tester 1 unless front shielding flaps 32 are in position, engaging the switches 75, completing the circuit. The tester 1 is also provided with side shield flaps 36. The side shield flaps 36 are provided with apertures 78 through which a tool 30 which is longer than the tester 1 may extend. FIG. 15 shows the tester 1 with safely shielding in place such that the safely lockout microswitches 75 will allow the circuit to be completed and the testing to proceed.

Figure 16:
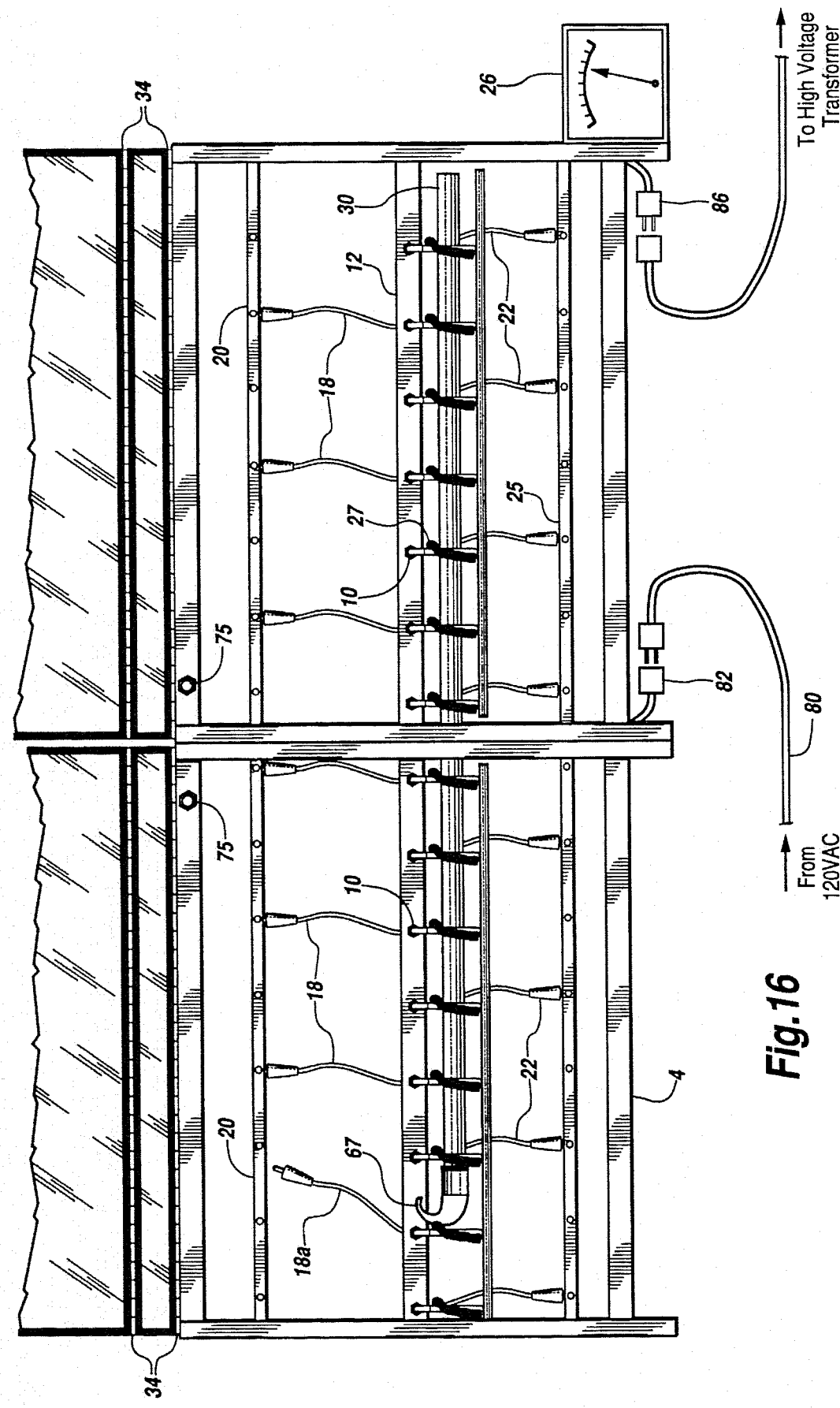
FIG. 16 is a front view of the live-line tool tester ready for testing with electrical connections and monitoring equipment in place.

FIG. 16 is a front view of the live-line tool tester 1 showing the electrical connector 82 and from the power source 80 to the tester 1 and connector 86 and from the tester 1 to the high voltage transformer (not shown). Leakage meter 26 is connected to the ground bus bar 25 to detect current being conducted through the tool being tested 30.

Figure 18:
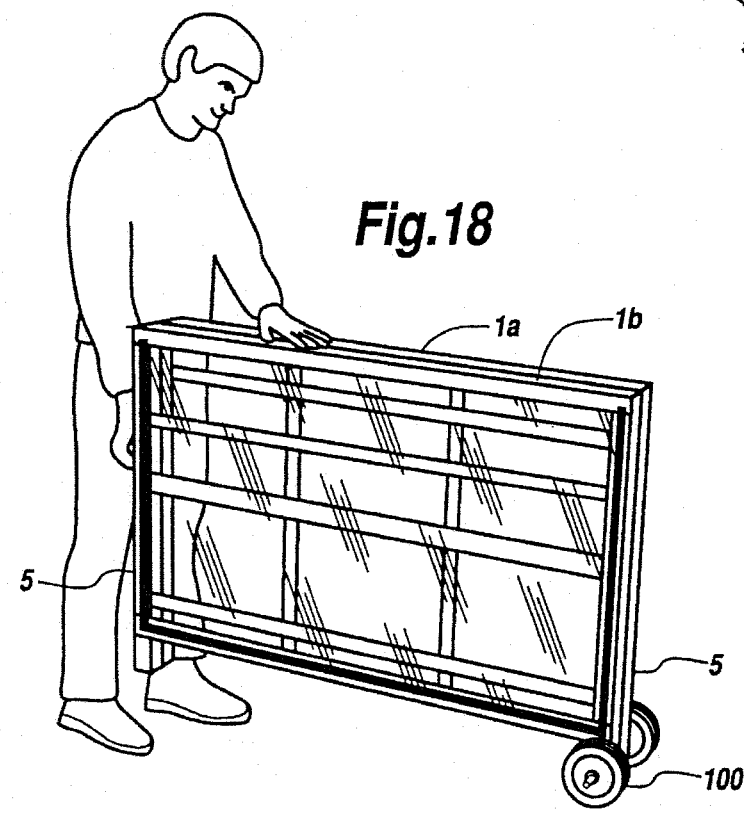
FIG. 18 shows the live-line tool tester ready for transportation to another site.

FIG. 17 shows the live-line tool tester 1 being unfolded about hinge 73 to be rigged for testing. The legs 5 will be displaced from one another into the A-frame configuration shown in FIG. 1. The legs 5 of the tester 1 are limited in their displacement distance by chain 6, best seen in FIGS. 14 and 15. FIG. 18 shows the tester 1 folded for transportation to another site. The tester 1 includes a set of removable wheels 100 and removable handle 102 to aid in moving the tester 1 from place to place.

Figure 19:
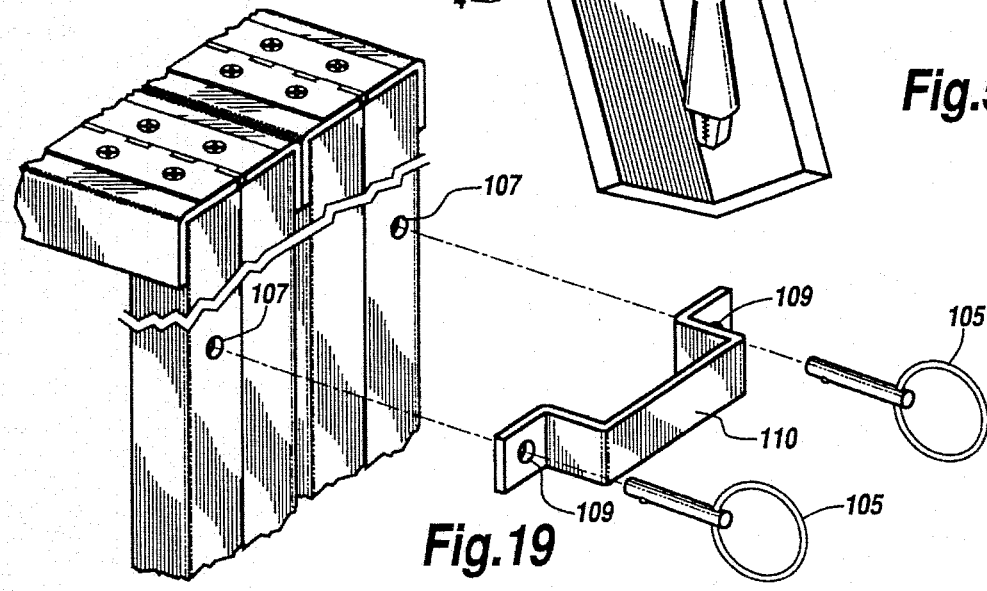
FIG. 19 shows the removable handle of the present invention.

The removable handle 102 is shown in detail in FIG. 19. Keys 105 are inserted into apertures 107 through holes 109 in the handle body 110. The worker in FIG. 18 is supporting the tester 1 by its handle 102.

While the present invention has been described in connection with the illustrated embodiments, it is not intended to limit the invention to the particular forms set forth, but on the contrary, it is intended to cover such alternatives, modifications, and equivalents as may be included in the spirit and scope of the invention as defined in the following claims.

We claim:

1. A live-line tool tester comprising:

a frame;

means for supporting a live-line tool to be tested, positioned at a plurality of locations along the frame and adapted to conduct electric current to the live-line tool;

means for connecting the supporting means to ground and to a source of high voltage in alternating sequence, whereby the supporting means causes the flow of electric current through discrete segments of a live-line tool; and means for detecting the flow of electric current through the supporting means.

2. The tool tester of claim 1 wherein the frame comprises at least two sections.

3. The tool tester of claim 2 further comprising hinge means connecting the sections.

4. The tool tester of claim 1 wherein the frame is an A-frame.

5. The tool tester of claim 1 wherein the means for supporting comprises a plurality of U-shaped hooks.

6. The tool tester of claim 5 further comprising a plurality of coils extending across mouths of the U,shaped hooks for receiving the live-line tool to be tested.

7. The tool tester of claim 6 further comprising a plurality of second coils attached to the U-shaped hooks and further attached to a spring tension bar wherein the second coil may be draped around the live-line tool to be tested and retained under the U-shaped hooks.

8. The tool tester of claim 5 further including a means for rotating, connecting the U-shaped hooks to the means for supporting for allowing the hooks to be rotated between a first position suitable for traveling and a second operational position.

9. The tool tester of claim 8 further comprising spring means attached to each of the U-shaped hooks for urging the U-shaped hooks against the means for supporting.

10. The tool tester of claim 1 wherein the means for connecting comprises a plurality of alligator clips.

11. The tool tester of claim 1 further comprising shielding means rotatably coupled to the frame for covering the means for supporting to protect an operator of the tool tester.

12. The tool tester of claim 11 further comprising a switch means mateably disposed between the frame and the shielding means wherein the shielding means depresses the switch means to complete an electrical circuit and to render the tool tester operable.

13. A portable live-line tool tester comprising:
    a frame comprising at least two sections, the sections connected by hinge means;
    means for supporting a live-line tool to be tested comprising a plurality of U-shaped hooks positioned at a plurality of locations along the frame, the U-shaped hooks adapted to conduct electric current to the live-line tool;
    means for connecting the supporting means to ground and to a source of high voltage in alternating sequence, whereby the supporting means causes the flow of electric current through discrete segments of the live-line tool;
    shielding means rotatably coupled to the frame for covering the means for supporting to protect and operator of the tool tester; and
    means for detecting the flow of electric current through the supporting means.

14. The tool tester of claim 13 further comprising switch means mateably disposed between adjacent sections, wherein the rotation of the sections about the hinge means to an end-to-end configuration depresses the switch means and renders the tool tester operable.

15. The tool tester of claim 14 further comprising a plurality of coils extending across mouths of the U-shaped hooks for receiving the tool to be tested.

16. The tool tester of claim 14 further comprising a plurality of second coils attached to the U-shaped hooks and further attached to a spring tension bar wherein the second coil may be draped around the tool to be tested and retained under the U-shaped hooks.

17. The tool tester of claim 13 further comprising a means for rotating which connects the U-shaped hooks to the means for supporting for allowing the hooks to be rotated between a first position suitable for traveling and a second operational position.

18. The tool tester of claim 16 further comprising spring means attached to each of the U-shaped hooks for urging the U-shaped hooks against the means for supporting.

19. The tool tester of claim 13 wherein the means for connecting comprises a plurality of alligator clips.

20. The tool tester of claim 13 further comprising a switch means mateably disposed between the frame and the shielding means wherein the shielding means depresses the switch means to complete an electrical circuit and to render the tool tester operable.

21. A process for testing live-line tools comprising the steps of:
    rotating sections of a frame of a tool tester around hinges until they are end-to-end;
    rotating a series of U-shaped hooks mounted on the frame from a first position suitable for transportation to a second position suitable for operation;
    placing the live-line tool to be tested upon a first coil means spanning the mount of the U's of the hooks;
    draping the tool with second coil means first ends attached to the U-shaped hooks and second ends attached to a spring tension bar;
    securing the spring tension bar under the U-shaped hooks;
    connecting alternate U-shaped hooks to ground;
    connecting the remaining hooks to a source of high voltage;
    monitoring the ground for a flow of electric current.

22. The method of claim 21 further comprising the step of placing shielding over the frame between the hooks and an operator to protect the operator.

23. The method of claim 21 further comprising the step of isolating segments of the tool by allowing the U-shaped hooks, adjacent to the segment to be isolated, to remain disconnected from the source of high voltage.

* * * * *